(12) United States Patent
Patel et al.

(10) Patent No.: US 11,664,192 B2
(45) Date of Patent: May 30, 2023

(54) TEMPERATURE CONTROL FOR INSERTABLE TARGET HOLDER FOR SOLID DOPANT MATERIALS

(71) Applicant: Applied Materials, Inc., Santa Clara, CA (US)

(72) Inventors: Shreyansh P. Patel, Gloucester, MA (US); Graham Wright, Newburyport, MA (US); Daniel Alvarado, Methuen, MA (US); Daniel R. Tieger, Manchester, MA (US); Brian S. Gori, Gloucester, MA (US); William R. Bogiages, Jr., Gloucester, MA (US); Benjamin Oswald, Gloucester, MA (US); Craig R. Chaney, Gloucester, MA (US)

(73) Assignee: Applied Materials, Inc., Santa Clara, CA (US)

( * ) Notice: Subject to any disclaimer, the term of this patent is extended or adjusted under 35 U.S.C. 154(b) by 64 days.

(21) Appl. No.: 17/403,223

(22) Filed: Aug. 16, 2021

(65) Prior Publication Data
US 2021/0375585 A1 Dec. 2, 2021

Related U.S. Application Data

(63) Continuation of application No. 16/735,125, filed on Jan. 6, 2020, now Pat. No. 11,170,973.
(Continued)

(51) Int. Cl.
*H01J 37/302* (2006.01)
*H01J 37/08* (2006.01)
*H01J 37/317* (2006.01)

(52) U.S. Cl.
CPC ............ *H01J 37/302* (2013.01); *H01J 37/08* (2013.01); *H01J 37/3171* (2013.01)

(58) Field of Classification Search
CPC ...... H01J 37/302; H01J 37/08; H01J 37/3171; H01J 2237/024; H01J 2237/081
See application file for complete search history.

(56) References Cited

U.S. PATENT DOCUMENTS 3,404,084 A   10/1968  Hamilton
4,061,800 A   12/1977  Anderson
(Continued)

FOREIGN PATENT DOCUMENTS

CN   1086853 A   5/1994
CN   1383179 A   12/2002
(Continued)

OTHER PUBLICATIONS

International Search Report and Written Opinion dated Sep. 8, 2022 in co-pending PCT application No. PCT/US2022/029784.
(Continued)

*Primary Examiner* — Sean M Luck
(74) *Attorney, Agent, or Firm* — Nields, Lemack & Frame, LLC

(57) ABSTRACT

An ion source with a target holder for holding a solid dopant material is disclosed. The ion source comprises a thermocouple disposed proximate the target holder to monitor the temperature of the solid dopant material. In certain embodiments, a controller uses this temperature information to vary one or more parameters of the ion source, such as arc voltage, cathode bias voltage, extracted beam current, or the position of the target holder within the arc chamber. Various embodiments showing the connections between the controller and the thermocouple are shown. Further, embodiments showing various placement of the thermocouple on the target holder are also presented.

14 Claims, 10 Drawing Sheets

Related U.S. Application Data

(60) Provisional application No. 62/913,023, filed on Oct. 9, 2019.

(56) References Cited

U.S. PATENT DOCUMENTS

| | | | |
|---|---|---|---|
| 4,152,478 A * | 5/1979 | Takagi | C23C 14/221 |
| | | | 428/221 |
| 4,631,448 A | 12/1986 | Tamura et al. | |
| 5,089,746 A | 2/1992 | Rosenblum et al. | |
| 5,180,477 A | 1/1993 | Ito | |
| 5,733,418 A | 3/1998 | Hershcovitch et al. | |
| 5,922,179 A * | 7/1999 | Mitro | C23C 14/022 |
| | | | 204/298.36 |
| 5,977,552 A * | 11/1999 | Foad | H01J 27/04 |
| | | | 250/424 |
| 6,048,813 A | 4/2000 | Hunter | |
| 6,156,172 A * | 12/2000 | Kadokura | H01J 37/3402 |
| | | | 204/298.26 |
| 6,682,634 B1 * | 1/2004 | Kahn | H01J 37/34 |
| | | | 204/298.12 |
| 6,768,121 B2 | 7/2004 | Horsky et al. | |
| 7,655,932 B2 | 2/2010 | Hatem et al. | |
| 7,820,981 B2 | 10/2010 | Horsky et al. | |
| 7,838,850 B2 | 11/2010 | Hahto et al. | |
| 8,324,592 B2 | 12/2012 | Ryding et al. | |
| 8,679,307 B2 * | 3/2014 | Fischione | G01N 1/32 |
| | | | 156/345.31 |
| 8,759,788 B1 | 6/2014 | Bassom | |
| 8,809,800 B2 | 8/2014 | Koo et al. | |
| 9,287,079 B2 * | 3/2016 | Chaney | H01J 27/022 |
| 9,396,902 B2 | 7/2016 | Biloiu et al. | |
| 10,014,164 B2 | 7/2018 | Druz et al. | |
| 10,600,611 B2 | 3/2020 | Becker et al. | |
| 10,957,509 B1 | 3/2021 | Wright et al. | |
| 11,170,967 B2 | 11/2021 | Bassom et al. | |
| 11,170,973 B2 | 11/2021 | Patel et al. | |
| 11,404,254 B2 | 8/2022 | Patel et al. | |
| 2002/0130270 A1 | 9/2002 | Reyes | |
| 2002/0153493 A1 | 10/2002 | Miyabayashi | |
| 2003/0125191 A1 | 7/2003 | Kim et al. | |
| 2004/0118452 A1 * | 6/2004 | Sohn | C23C 14/243 |
| | | | 137/13 |
| 2004/0188631 A1 | 9/2004 | Horsky et al. | |
| 2006/0097645 A1 | 5/2006 | Horsky | |
| 2006/0163489 A1 | 7/2006 | Low et al. | |
| 2007/0158188 A1 * | 7/2007 | Ivanov | H01J 37/3408 |
| | | | 204/298.02 |
| 2007/0281081 A1 | 12/2007 | Nakamura et al. | |
| 2008/0169427 A1 | 7/2008 | Hatem et al. | |
| 2009/0183679 A1 | 7/2009 | McIntyre et al. | |
| 2009/0289197 A1 | 11/2009 | Slocum et al. | |
| 2009/0309041 A1 | 12/2009 | Kurunczi et al. | |
| 2010/0148088 A1 | 6/2010 | Radovanov et al. | |
| 2012/0048723 A1 | 3/2012 | Chaney | |
| 2012/0104273 A1 | 5/2012 | Ryding et al. | |
| 2012/0255490 A1 | 10/2012 | Tanjo | |
| 2013/0072008 A1 * | 3/2013 | Perel | H01J 37/3171 |
| | | | 438/514 |
| 2013/0072088 A1 | 3/2013 | Schneider | |
| 2013/0260544 A1 | 10/2013 | Koo et al. | |
| 2013/0313971 A1 | 11/2013 | Biloiu et al. | |
| 2014/0061033 A1 | 3/2014 | Biskebom et al. | |
| 2014/0238637 A1 | 8/2014 | Tanaka | |
| 2014/0319369 A1 | 10/2014 | Koo et al. | |
| 2015/0034837 A1 | 2/2015 | Koo et al. | |
| 2015/0047079 A1 * | 2/2015 | Kozakai | H01J 37/08 |
| | | | 313/363.1 |
| 2017/0140898 A1 | 5/2017 | Kawaguchi | |
| 2017/0247789 A1 | 8/2017 | Yarmolich | |
| 2018/0005793 A1 | 1/2018 | Chaney et al. | |
| 2019/0180971 A1 | 6/2019 | Becker et al. | |
| 2020/0090916 A1 | 3/2020 | Patel | |
| 2021/0110995 A1 | 4/2021 | Patel et al. | |
| 2022/0406554 A1 | 12/2022 | Wright et al. | |

FOREIGN PATENT DOCUMENTS

| | | |
|---|---|---|
| CN | 1429793 A | 7/2003 |
| CN | 1946868 A | 4/2007 |
| CN | 105390355 A | 3/2016 |
| CN | 107045971 A | 8/2017 |
| JP | 4-28862 A | 1/1992 |
| JP | 5-54809 A | 3/1993 |
| JP | 5-117843 A | 5/1993 |
| JP | 5-174762 A | 7/1993 |
| JP | 2003-323850 A | 11/2003 |
| JP | 2004-359985 A | 12/2004 |
| JP | 2006-70351 A | 3/2006 |
| JP | 2010-111884 A | 5/2010 |
| JP | 2011-525036 A | 9/2011 |
| JP | 2012-1764 A | 1/2012 |
| JP | 2012-221629 A | 11/2012 |
| JP | 2013-536561 A | 9/2013 |
| JP | 2018-59134 A | 4/2018 |
| KR | 10-0793366 B1 | 1/2008 |
| KR | 2011-0139575 A | 12/2011 |
| KR | 10-1144222 B1 | 5/2012 |
| KR | 10-1209107 B1 | 12/2012 |
| KR | 10-1638443 B1 | 7/2016 |
| KR | 10-2018-0073766 A | 7/2018 |
| TW | 200733243 A | 9/2007 |
| TW | 200835398 A | 8/2008 |
| TW | 201225149 A | 6/2012 |
| TW | I413149 B | 10/2013 |
| TW | 201349342 A | 12/2013 |
| TW | I517200 B | 1/2016 |
| TW | I602239 B | 10/2017 |
| TW | 201937521 A | 9/2019 |
| TW | 202119452 A | 5/2021 |
| WO | 2006/100487 A1 | 9/2006 |
| WO | 2009/088770 A1 | 7/2009 |
| WO | 2014/179585 A1 | 11/2014 |
| WO | 2015/017635 A1 | 2/2015 |
| WO | 2019/118120 A1 | 6/2019 |

OTHER PUBLICATIONS

Notice of allowance dated Mar. 8, 2022 in co-pending U.S. Appl. No. 16/269,120.
International Search Report and Written Opinion dated Mar. 5, 2019 in co-pending PCT application No. PCT/US2018/061000.
International Search Report and Written Opinion dated Nov. 19, 2019 in co-pending PCT application No. PCT/US2019/045052.
International Search Report and Written Opinion dated Dec. 30, 2020 in corresponding PCT application No. PCT/US2020/050857.
International Search Report and Written Opinion dated Feb. 2, 2021 in co-pending PCT application No. PCT/US2020/056802.
Office action dated Mar. 23, 2021 in co-pending U.S. Appl. No. 16/269,120.
Office action dated May 14, 2021 in co-pending U.S. Appl. No. 16/269,120.
Office action dated Feb. 17, 2021 in co-pending U.S. Appl. No. 16/735,125.
Notice of allowance dated Jun. 10, 2021 in co-pending U.S. Appl. No. 16/735,125.
Office action dated Nov. 9, 2021 in co-pending U.S. Appl. No. 16/269,120.

* cited by examiner

TEMPERATURE CONTROL FOR INSERTABLE TARGET HOLDER FOR SOLID DOPANT MATERIALS

This application is a continuation of U.S. patent application Ser. No. 16/735,125 filed Jan. 6, 2020, which claims priority of U.S. Provisional Application Ser. No. 62/913,023 filed Oct. 9, 2019, the disclosures of which are incorporated herein by reference in their entireties.

FIELD

Embodiments of the present disclosure relate to an ion source, and more particularly, an ion source with an insertable target holder to hold solid dopant materials, wherein the temperature of the dopant material or the target holder may be measured and optionally controlled.

BACKGROUND

Various types of ion sources may be used to create the ions that are used in semiconductor processing equipment. For example, an indirectly heated cathode (IHC) ion source operates by supplying a current to a filament disposed behind a cathode. The filament emits thermionic electrons, which are accelerated toward and heat the cathode, in turn causing the cathode to emit electrons into the arc chamber of the ion source. The cathode is disposed at one end of an arc chamber. A repeller may be disposed on the end of the arc chamber opposite the cathode. The cathode and repeller may be biased so as to repel the electrons, directing them back toward the center of the arc chamber. In some embodiments, a magnetic field is used to further confine the electrons within the arc chamber. A plurality of sides is used to connect the two ends of the arc chamber.

An extraction aperture is disposed along one of these sides, proximate the center of the arc chamber, through which the ions created in the arc chamber may be extracted.

In certain embodiments, it may be desirable to utilize a material that is in solid form as a dopant species. For example, a crucible or target holder may be used to hold the metal such that when the metal liquifies, it remains in the target holder. Use of pure solid metal directly for ion implant increases the beam current available for wafer implant.

However, there may be issues associated with the use of a target holder for solid dopant materials. For example, when using metals with low melting and boiling temperatures in a contained target holder, very high temperatures may be problematic. For example, the dopant material may become unstable and be prone to runaway effects that can cause inconsistent beam performance and lead to the undesired accumulation of dopant material in the arc chamber.

Therefore, an ion source that may be used with solid dopant materials having low melting temperatures, such as certain metals, and is capable of monitoring and controlling its internal temperature, would be beneficial.

SUMMARY

An ion source with a target holder for holding a solid dopant material is disclosed. The ion source comprises a thermocouple disposed proximate the target holder to monitor the temperature of the solid dopant material. In certain embodiments, a controller uses this temperature information to vary one or more parameters of the ion source, such as arc voltage, cathode bias voltage, extracted beam current, or the position of the target holder within the arc chamber. Various embodiments showing the connections between the controller and the thermocouple are shown. Further, embodiments showing various placement of the thermocouple on the target holder are also presented.

According to one embodiment, an indirectly heated cathode ion source is disclosed. The indirectly heated cathode ion source comprises an arc chamber, comprising a plurality of walls connecting a first end and a second end; an indirectly heated cathode disposed on the first end of the arc chamber; a target holder, having a pocket to hold a dopant material; a thermocouple in contact with the target holder; and a controller in communication with the thermocouple, wherein the controller varies a parameter of the ion source based on a temperature measured by the thermocouple. In certain embodiments, the ion source further comprises an actuator in communication with the target holder to move the target holder between a first position and a second position, and wherein the parameter comprises the position of the target holder. In some embodiments, the parameter is selected from the group consisting of arc voltage, filament current, cathode bias voltage, flow rate of feed gas, and beam extraction current. In certain embodiments, the ion source further comprises a heating element in communication with the target holder, and therein the parameter comprises the current supplied to the heating element. In some embodiments, the ion source further comprises an actuator assembly, the actuator assembly comprising: wires to electrically connect the thermocouple to the controller; a housing, comprising a rear housing, a front housing and an outer housing connecting the rear housing and the front housing; a shaft affixed to the target holder, and having a retaining plate disposed within the housing; a bellows disposed within the housing and affixed to the retaining plate on one end and to the rear housing on an opposite end; and an actuator to linearly translate the shaft. In some embodiments, a connector is mounted in the front housing, and the wires pass from the controller through a space between the outer housing and the bellows, and terminate at the connector. In some further embodiments, a second connector is mated to the connector, and thermocouple wires are disposed between the second connector and the thermocouple. In some embodiments, the thermocouple wires are coiled to allow target holder position adjustment with respect to the arc chamber. In some embodiments, the thermocouple wires are encased in an Inconel braid. In some embodiments, the thermocouple wires are encased in alumina tubes. In certain embodiments, the wires pass through a hollow interior of the shaft. In certain embodiments, the target holder comprises a target base, a crucible plug, a crucible and a porous plug. In some embodiments, the thermocouple is disposed on an outer surface of the crucible. In certain embodiments, a cavity is disposed on an interior surface of the target holder, and the thermocouple is disposed in the cavity on an outer surface of the crucible plug. In some embodiments, potting material is used to hold the thermocouple in place. In some embodiments, a set screw is used to hold the thermocouple in place. In certain embodiments, a spring is disposed in the cavity to hold the thermocouple in place. In some embodiments, the ion source comprises a heating element in communication with the target holder, wherein the heating element comprises resistive wires. In certain embodiments, the resistive wires are in communication with the crucible or the crucible plug.

According to another embodiment, an assembly for use with an ion source is disclosed. The assembly comprises a connector; a thermocouple; and wires disposed between the connector and the thermocouple. In certain embodiments, the wires are coiled. In certain embodiments, the wires are individually insulated. In some embodiments, the insulated wires are encased in an Inconel braid. In certain embodiments, the insulated wires are encased in alumina tubes.

According to another embodiment, a target holder to hold a dopant material for use in an ion source is disclosed. The target holder comprises a target base; a crucible shaped as a hollow cylinder; a crucible plug to cover one open end of the crucible and disposed proximate the target base; a porous plug to cover an opposite end of the crucible, wherein gaseous dopant material may pass through the porous plug; and a thermocouple in communication with the target holder. In certain embodiments, the thermocouple is disposed on the outer surface of the crucible. In other embodiments, the thermocouple is disposed in a channel in the wall of the crucible. In some embodiments, there is a cavity disposed in the target base proximate the crucible plug and the thermocouple is disposed in the cavity proximate the crucible plug. In certain embodiments, a channel is disposed in the target base, wherein the channel in communication with the cavity to allow wires to be routed to the thermocouple. In some embodiments, potting material is used to hold the thermocouple in place. In certain embodiments, a set screw is used to hold the thermocouple in place. In some embodiments, the target holder comprises a shaft affixed to the target base. In some embodiment, an interior of the shaft is hollow to allow wires to be routed through the hollow interior of the shaft to the thermocouple.

According to another embodiment, an indirectly heated cathode ion source is disclosed. The ion source comprises an arc chamber, comprising a plurality of walls connecting a first end and a second end; an indirectly heated cathode disposed on the first end of the arc chamber; a target holder, having a pocket to hold a dopant material, wherein the target holder is movable within the arc chamber; and a controller, wherein the controller varies a position of the target holder within the arc chamber based on a temperature of the dopant material. In some embodiments, the temperature of the dopant material is determined using optical measurements, a pyrometer, color dots, a thermocouple, a wireless thermocouple reader or an RTD (resistance temperature detector). In certain embodiments, the temperature of the dopant material is determined using a thermocouple. In some embodiments, the temperature of the dopant material is estimated based on a temperature of a component within the arc chamber.

BRIEF DESCRIPTION OF THE FIGURES

For a better understanding of the present disclosure, reference is made to the accompanying drawings, which are incorporated herein by reference and in which.

DETAILED DESCRIPTION

As noted above, at very high temperatures, the solid dopant in an ion source may melt too quickly and create unwanted accumulation of dopant in the arc chamber. At low temperatures, the solid dopant may not melt at all.

Figure 1:
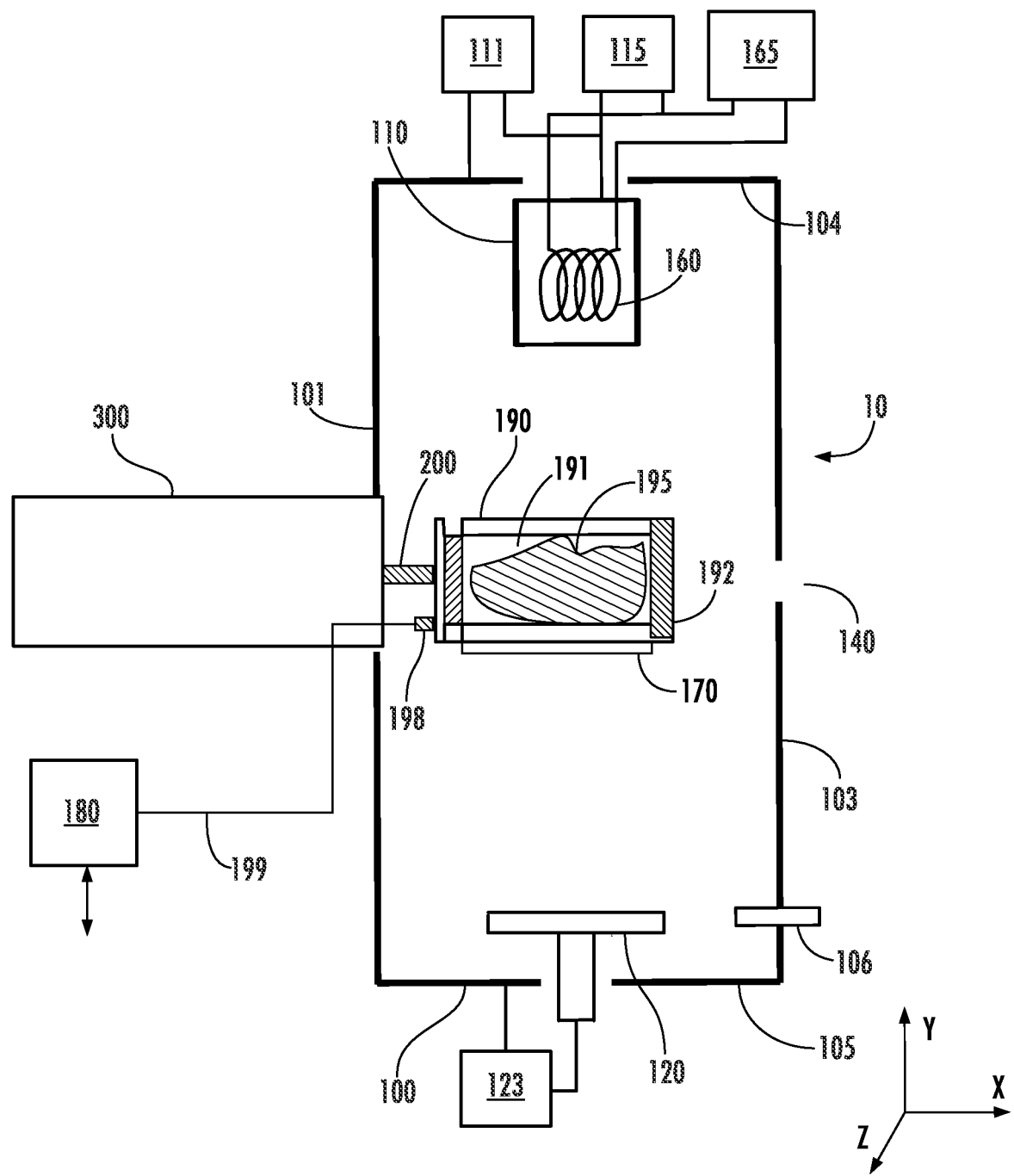
FIG. 1 is an indirectly heated cathode (IHC) ion source with an insertable target holder in accordance with one embodiment.

FIG. 1 shows an IHC ion source 10 with a target holder that overcomes these issues. The IHC ion source 10 includes an arc chamber 100, comprising two opposite ends, and walls 101 connecting to these ends. The walls 101 of the arc chamber 100 may be constructed of an electrically conductive material and may be in electrical communication with one another. In some embodiments, a liner may be disposed proximate one or more of the walls 101. A cathode 110 is disposed in the arc chamber 100 at a first end 104 of the arc chamber 100. A filament 160 is disposed behind the cathode 110. The filament 160 is in communication with a filament power supply 165. The filament power supply 165 is configured to pass a current through the filament 160, such that the filament 160 emits thermionic electrons. Cathode bias power supply 115 biases filament 160 negatively relative to the cathode 110, so these thermionic electrons are accelerated from the filament 160 toward the cathode 110 and heat the cathode 110 when they strike the back surface of cathode 110. The cathode bias power supply 115 may bias the filament 160 so that it has a voltage that is between, for example, 200V to 1500V more negative than the voltage of the cathode 110. The voltage difference between the cathode 110 and the filament 160 may be referred to as cathode bias voltage. The cathode 110 then emits thermionic electrons on its front surface into arc chamber 100.

Thus, the filament power supply 165 supplies a current to the filament 160. The cathode bias power supply 115 biases the filament 160 so that it is more negative than the cathode 110, so that electrons are attracted toward the cathode 110 from the filament 160. In certain embodiments, the cathode 110 may be biased relative to the arc chamber 100, such as by bias power supply 111. The voltage difference between the arc chamber 100 and the cathode 110 may be referred to as arc voltage. In other embodiments, the cathode 110 may be electrically connected to the arc chamber 100, so as to be at the same voltage as the walls 101 of the arc chamber 100. In these embodiments, bias power supply 111 may not be employed and the cathode 110 may be electrically connected to the walls 101 of the arc chamber 100. In certain embodiments, the arc chamber 100 is connected to electrical ground.

On the second end 105, which is opposite the first end 104, a repeller 120 may be disposed. The repeller 120 may be biased relative to the arc chamber 100 by means of a repeller bias power supply 123. In other embodiments, the repeller 120 may be electrically connected to the arc chamber 100, so as to be at the same voltage as the walls 101 of the arc chamber 100. In these embodiments, repeller bias power supply 123 may not be employed and the repeller 120 may be electrically connected to the walls 101 of the arc chamber 100. In still other embodiments, a repeller 120 is not employed.

The cathode 110 and the repeller 120 are each made of an electrically conductive material, such as a metal or graphite.

In certain embodiments, a magnetic field is generated in the arc chamber 100. This magnetic field is intended to confine the electrons along one direction. The magnetic field typically runs parallel to the walls 101 from the first end 104 to the second end 105. For example, electrons may be confined in a column that is parallel to the direction from the cathode 110 to the repeller 120 (i.e. the y direction). Thus, electrons do not experience any electromagnetic force to move in the y direction. However, movement of the electrons in other directions may experience an electromagnetic force.

Disposed on one side of the arc chamber 100, referred to as the extraction plate 103, may be an extraction aperture 140. In FIG. 1, the extraction aperture 140 is disposed on a side that is parallel to the Y-Z plane (perpendicular to the page). Further, the IHC ion source 10 also comprises a gas inlet 106 through which the gas to be ionized may be introduced to the arc chamber 100.

In certain embodiments, a first electrode and a second electrode may be disposed on respective opposite walls 101 of the arc chamber 100, such that the first electrode and the second electrode are within the arc chamber 100 on walls adjacent to the extraction plate 103. The first electrode and the second electrode may each be biased by a respective power supply. In certain embodiments, the first electrode and the second electrode may be in communication with a common power supply. However, in other embodiments, to allow maximum flexibility and ability to tune the output of the IHC ion source 10, the first electrode may be in communication with a first electrode power supply and the second electrode may be in communication with a second electrode power supply.

A controller 180 may be in communication with one or more of the power supplies such that the voltage or current supplied by these power supplies may be modified. The controller 180 may include a processing unit, such as a microcontroller, a personal computer, a special purpose controller, or another suitable processing unit. The controller 180 may also include a non-transitory storage element, such as a semiconductor memory, a magnetic memory, or another suitable memory. This non-transitory storage element may contain instructions and other data that allows the controller 180 to perform the functions described herein.

The IHC ion source 10 also includes a target holder 190, which can be inserted into and retracted from the arc chamber 100. In the embodiment of FIG. 1, the target holder 190 enters the arc chamber along one of the walls 101 of the arc chamber 100. In certain embodiments, the target holder 190 may enter the arc chamber 100 at the midplane between the first end 104 and the second end 105. In another embodiment, the target holder 190 may enter the arc chamber 100 at a location different from the midplane. In the embodiment shown in FIG. 1, the target holder 190 enters the arc chamber 100 through the side opposite the extraction aperture 140. However, in other embodiments, the target holder 190 may enter through the sides that are adjacent to the extraction plate 103. The target holder 190 may move between a first position and a second position.

The target holder 190 has a cavity or pocket 191 into which the dopant material 195 may be disposed. The pocket 191 may have a bottom surface and sidewalls extending upward from the bottom surface. In certain embodiments, the sidewalls may be vertical. In other embodiments, the sidewalls may be slanted outward from the bottom surface. In some embodiments, the sidewalls and the bottom surface meet at a rounded edge. The bottom surface and the sidewalls form a cavity which is closed at the bottom. In other words, much like a traditional cup, the dopant material 195 is inserted or removed via the open top, while the sidewalls and bottom surface form a sealed structure from which the dopant material 195 cannot exit. In another embodiment, the pocket 191 may be enclosed, such that the dopant material 195 is disposed inside the pocket 191. For example, a hollow cylindrical crucible may be employed to create the pocket 191. A porous plug 192 may be used to hold the dopant material inside the pocket 191 and to allow vapors to exit the pocket 191. The porous plug 192 may be graphite foam, for example. The feed rate of the dopant material from the target holder 190 may also be controlled by adding patterned holes of various size to the porous plug 192 or any other wall of the target holder 190. Any of the walls of the target holder 190 may be a porous material and used for controlled feed of the dopant material into the arc chamber 100.

A dopant material 195, such as indium, aluminum, antimony or gallium, may be disposed within the pocket 191 of the target holder 190. The dopant material 195 may be in the form of a solid when placed in the pocket 191. This may be in the form of a block of material, filings, shavings, balls, or other shapes. In certain embodiments, the dopant material 195 may melt and become a liquid. Therefore, in certain embodiments, the target holder 190 is configured to enter the arc chamber 100 such that the open end is facing upward and the sealed bottom is facing downward so that melted dopant material 195 cannot flow from the target holder 190 into the arc chamber 100, but rather remains in the target holder 190. In other words, the IHC ion source 10 and the target holder 190 are oriented such that the dopant material 195 is retained within the pocket 191 by gravity.

A thermocouple 198 may be in proximity to the target holder 190 or the dopant material 195. This thermocouple 198 may be in communication with the controller 180. The thermocouple 198 may comprise one or more wires 199 that electrically connect the thermocouple 198 to the controller 180.

In certain embodiments, the thermocouple 198 may be fixed to the outside of the target holder 190. In other embodiments, the thermocouple 198 may include a rigid sheath that may be used to position relative to the target holder. In another embodiment, the thermocouple point of measurement may be directly inside the pocket 191, holding the dopant material 195. In these embodiments, the corrosion of thermocouple 198 may be prevented by using a ceramic insulator sheath to the protect the thermocouple wires.

During operation, the filament power supply 165 passes a current through the filament 160, which causes the filament 160 to emit thermionic electrons. These electrons strike the back surface of the cathode 110, which may be more positive than the filament 160, causing the cathode 110 to heat, which in turn causes the cathode 110 to emit electrons into the arc chamber 100. These electrons collide with the molecules of gas that are fed into the arc chamber 100 through the gas inlet 106. A carrier gas, such as argon, or an etching gas, such as fluorine, may be introduced into the arc chamber 100 through a suitably located gas inlet 106. The combination of electrons from the cathode 110, the gas and the positive potential creates a plasma. In certain embodiments, the electrons and positive ions may be somewhat confined by a magnetic field. In certain embodiments, the plasma is confined near the center of the arc chamber 100, proximate the extraction aperture 140. Chemical etching or sputtering by the plasma transforms the dopant material 195 into the gas phase and causes ionization. The ionized feed material can then be extracted through the extraction aperture 140 and used to prepare an ion beam.

Negative ions and neutral atoms that are sputtered or otherwise released from the dopant material 195 are attracted toward the plasma, since the plasma is maintained at a more positive voltage than the target holder 190.

In certain embodiments, the dopant material 195 is heated and vaporized due to the heat created by the plasma. However, in other embodiments, the dopant material 195 may be heated by additional means as well. For example, a heating element 170 may be disposed within or on the target holder 190 to further heat the dopant material 195. The heating element 170 may be a resistive heating element, or some other type of heater.

In certain embodiments, the target holder 190 may be made of a conductive material and may be grounded. In a different embodiment, the target holder 190 may be made of a conductive material and may be electrically floated. In a different embodiment, the target holder 190 may be made of a conductive material and may be maintained at the same voltage as the walls 101. In other embodiments, the target holder 190 may be made of an insulating material.

In yet another embodiment, the target holder 190 may be biased electrically with respect to the arc chamber 100. For example, the target holder 190 may be made from a conductive material and may be biased by an independent power supply (not shown) so as to be at a different voltage than the walls 101. This voltage may be more positive or more negative than the voltage applied to the walls 101. In this way, electrical biasing may be used to sputter the dopant material 195.

The controller 180 may monitor the temperature of the dopant material 195 using the thermocouple 198. In certain embodiments, the controller 180 may be in communication with a thermocouple 198 and with the heating element 170. Thus, the controller 180 may control the heating element 170 to maintain the dopant material 195 at a desired or predetermined temperature. In other words, the controller 180 may vary the current through the heating element 170 to maintain a desired temperature, as measured by the thermocouple 198. This may allow the controller 180 to control the feed rate of dopant material 195 into the arc chamber 100. In other embodiments, the controller 180 may indirectly measure the temperature of the dopant material 195, such as by measuring the temperature of the target holder 190 or some other component.

The target holder 190 is in communication with one end of shaft 200. The opposite end of the shaft 200 may be in communication with an actuator assembly 300. The actuator assembly 300 may be attached directly to one of the walls 101. In other embodiments, the actuator assembly 300 may be set back from the wall 101 to allow the target holder 190 to be retracted out of the main cylinder of the arc chamber 100. The actions of the actuator assembly 300 allow the target holder 190 to move linearly within the arc chamber 100.

Figure 2:
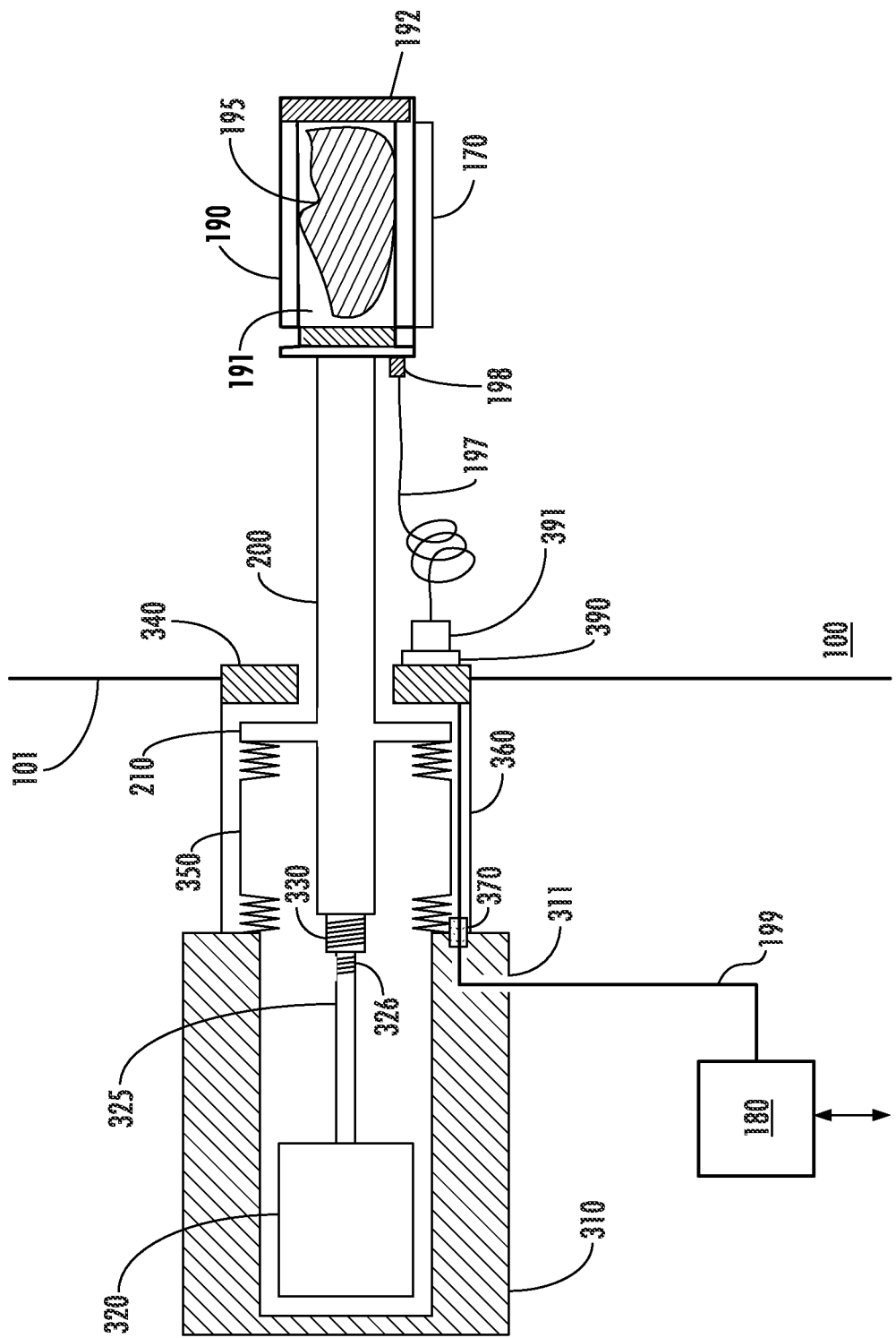
FIG. 2 shows the actuator assembly and target holder according to one embodiment.

FIG. 2 shows one embodiment of the actuator assembly 300. In this embodiment, the actuator assembly 300 includes a rear housing 310 and a front housing 340. The front housing 340 may be bolted or otherwise connected to one of the walls 101 of the arc chamber 100. Alternatively, the front housing 340 may be set back from the walls 101. An outer housing 360 may be used to connect the rear housing 310 and the front housing 340.

Inside the rear housing 310 is an actuator 320. The actuator 320 may have a drive shaft 325. In certain embodiments, the actuator 320 is an electric motor, although other types of actuator may be used. In one embodiment, the drive shaft 325 has a threaded distal end 326. A correspondingly threaded member 330 may be in communication with the threaded distal end 326. The threaded member 330 may be affixed to the shaft 200. In this way, when the drive shaft 325 rotates, the threaded member 330 is drawn to the actuator 320 or moved away from the actuator 320, depending on the direction of rotation. Since the shaft 200 is affixed to the threaded member 330, the shaft 200 similarly is translated linearly in the X direction by the rotational movement of the drive shaft 325. This allows the target holder 190 to be disposed in different locations within the arc chamber 100.

In this embodiment, the shaft 200 includes a retaining plate 210. The retaining plate 210 is disposed inside the actuator assembly 300 behind the front housing 340. The retaining plate 210 is welded or otherwise connected to bellows 350. In certain embodiments, the bellows 350 may be metal. The bellows 350 may also be welded or otherwise attached to the rear housing 310. The bellows 350 and the retaining plate 210 form the barrier between the vacuum conditions in the arc chamber 100 and the atmospheric conditions outside of the arc chamber 100. Thus, when the drive shaft 325 rotates, the bellows 350 expands and contracts based on the direction of motion of the shaft 200.

Note that the thermocouple 198 is disposed inside the arc chamber 100, and the wires 199 need to exit the arc chamber 100, while preserving the integrity of the vacuum conditions. In the embodiment of FIG. 2, a first connector 390 is mounted inside the arc chamber 100 on the front housing 340. Wires 199 extend from outside the actuator assembly 300 to the first connector 390. In this embodiment, a channel 311 may be created in the rear housing 310 to allow the wires 199 to pass out of the actuator assembly 300. The wires 199 may then pass in the space between the bellows 350 and the outer housing 360. This space is part of the vacuum environment, and therefore a vacuum feedthrough 370 is used to maintain the vacuum. A vacuum feedthrough is a member that allows the passage of wires 199, but maintains the pressure difference between the two sides of the feedthrough. Thus, the wires 199 pass through channel 311 in the rear housing 310, then pass through the vacuum feedthrough 370. The wires 199 then pass through the space between the outer housing 360 and the bellows 350 and finally terminate at the first connector 390.

A second connector 391 mates with the first connector 390. Thermocouple wires 197 extend from the second connector 391 to the thermocouple 198. The thermocouple 198 may be a K type thermocouple. Further, the thermocouple wires 197 attached to the thermocouple 198 may be insulated. For example, in one embodiment, each of the two thermocouple wires 197 is individually coated with an insulating material. The two thermocouple wires 197 may then be wrapped together in an Inconel braid. In other words, the thermocouple wires 197 are individually coated for electrical insulation and the pair are then wrapped to protect them from the harsh environment in the arc chamber 100. In another embodiment, the thermocouple wires 197 may be encased in alumina tubes.

In certain embodiments, the thermocouple wires 197 are coiled, as shown in FIG. 2. In this way, when the target holder 190 is extended and retracted, the thermocouple wires 197 coil and uncoil to compensate for the change in length.

In one embodiment, the thermocouple 198, the thermocouple wires 197 and the second connector 391 may be a replaceable part. Further, as described above, the thermocouple wires 197 in this embodiment may be individually insulated and then wrapped in a braid. Further, the thermocouple wires 197 may be coiled to allow for changes in length without kinking or interference.

A heating element 170 may be disposed within or on the target holder 190 to further heat the dopant material 195. In certain embodiments, wires associated with the heating element 170 are routed with the thermocouple wires 197.

The thermocouple 198 may be attached to the target holder 190 in a plurality of ways, which are described below.

Figure 3:
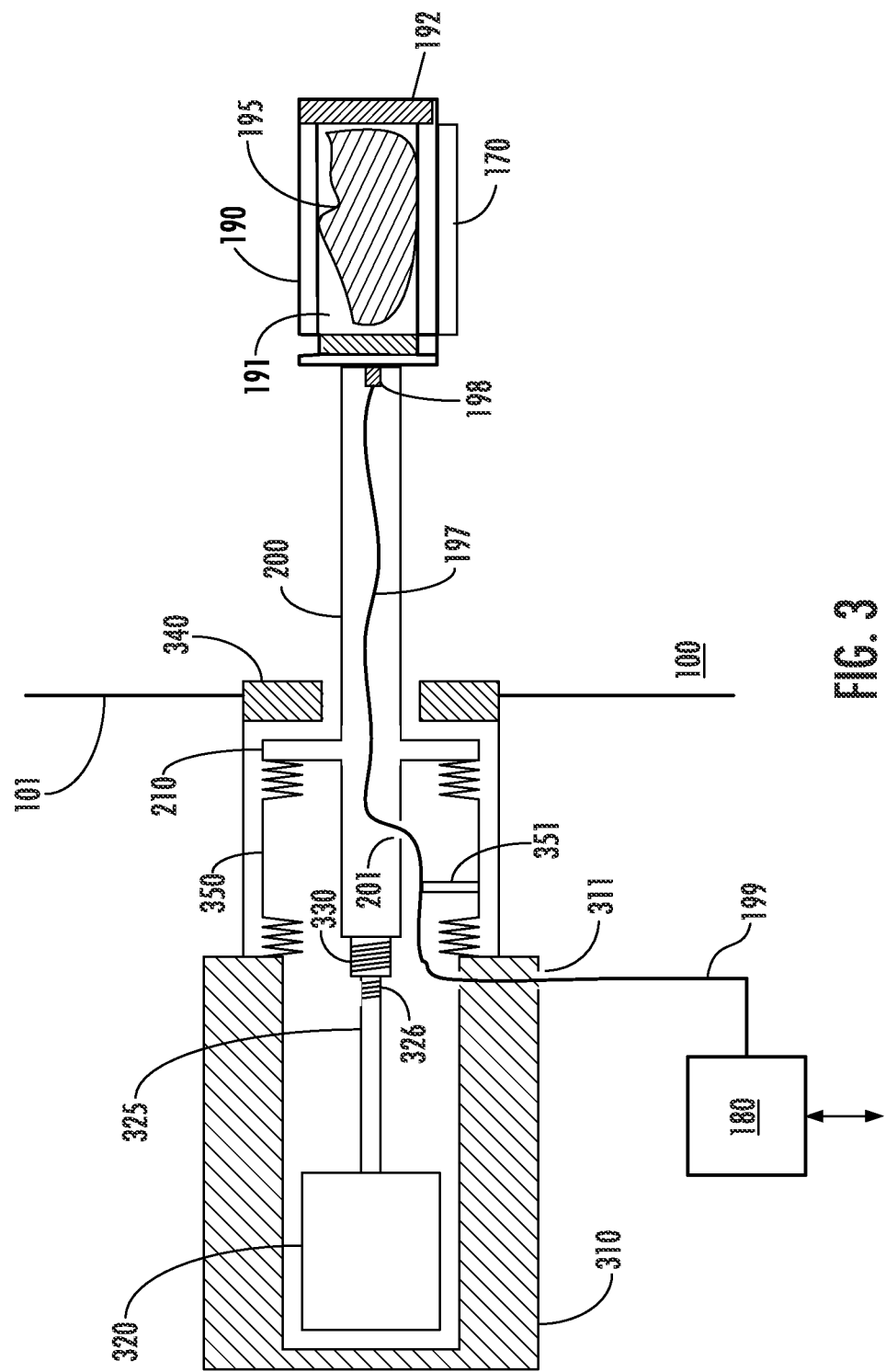
FIG. 3 shows the actuator assembly and target holder according to a second embodiment.
Figure 4:
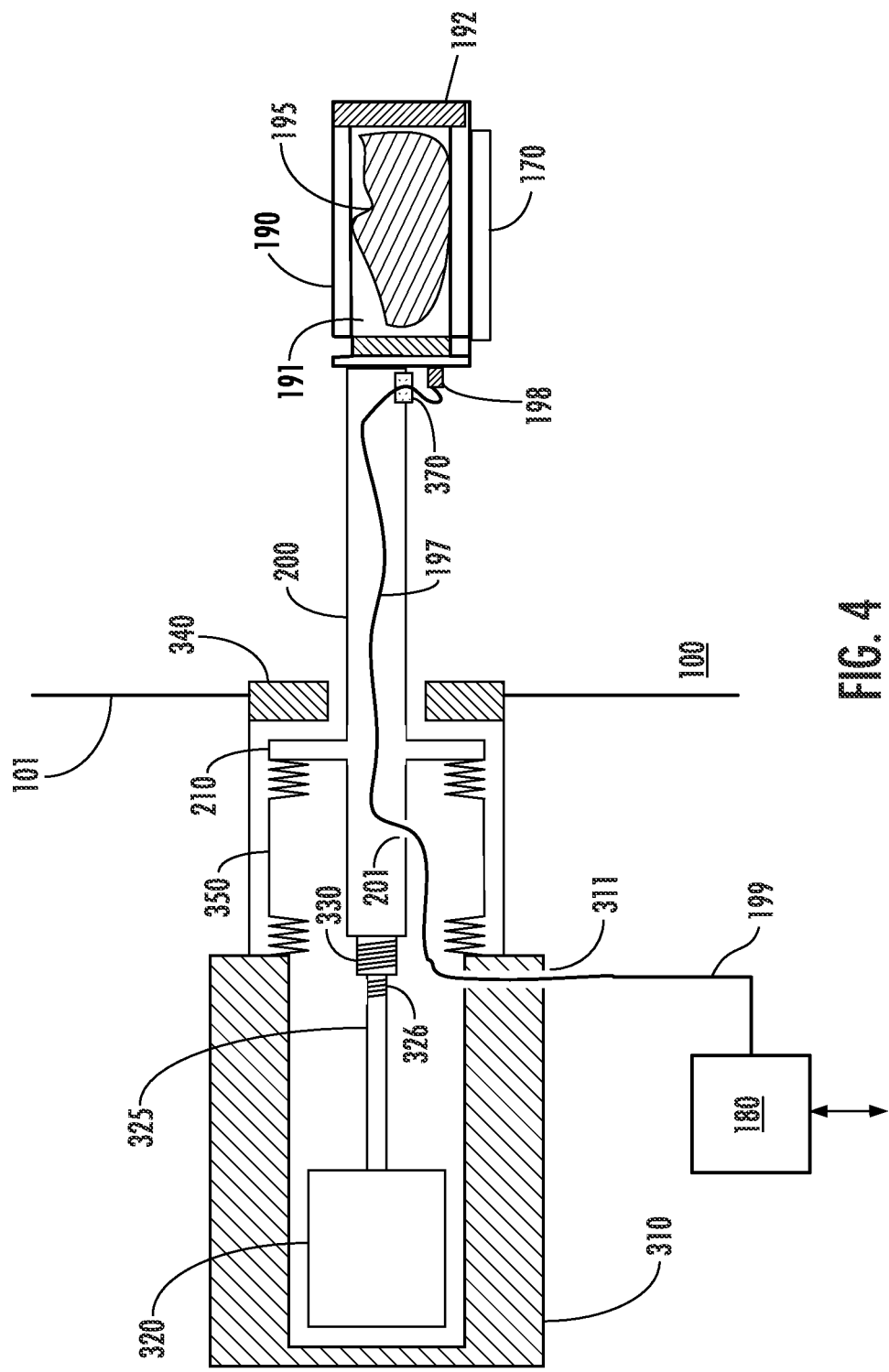
FIG. 4 shows the actuator assembly and target holder according to a third embodiment.

FIG. 3 shows a second embodiment of an actuator assembly 300. Many of the components are the same as shown in FIG. 2 and have been given identical reference designators. In this embodiment, the shaft 200 may be hollow such that thermocouple wires 197 may be routed through an interior of the shaft 200. The shaft 200 also has an opening 201 to the hollow interior. The opening 201 may be located on the side of the retaining plate 210 further from the target holder 190. In this way, the opening 201 is in atmospheric conditions. If the thermocouple 198 is located within the hollow interior of the shaft 200, a vacuum feedthrough may not be needed. However, if the thermocouple 198 is located on an exterior surface of the target holder 190, such as shown in FIG. 4, a vacuum feedthrough 370 may be used to preserve the vacuum within the arc chamber 100. The vacuum feedthrough 370 would be disposed at the entrance to the hollow interior of the shaft 200.

The thermocouple wires 197 pass through the opening 201 and may exit through the channel 311 in the rear housing 310. In certain embodiments, one or more cable mounts 351 may be used to hold the thermocouple wires 197 in place. In certain embodiments, the wires 199 that are in communication with the controller 180 are the same as the thermocouple wires 197 that pass through the hollow interior of the shaft 200. In other embodiments, a connector may be disposed between the thermocouple 198 and the controller 180 to create two separate wire segments. For example, the portion of the thermocouple wires that are exposed to the plasma may need to be replaced more often. Therefore, this section of the wires may be formed as a replaceable unit by inserting a connector between the thermocouple 198 and the controller 180.

Thus, in this embodiment, the shaft has a hollow interior that is used to route the thermocouple wires 197 from the thermocouple 198 to the interior of the actuator assembly 300. As stated, a vacuum feedthrough 370 may be employed at the entrance to the interior of the shaft 200 if the thermocouple 198 is disposed in vacuum conditions, as shown in FIG. 4.

In certain embodiments, the thermocouple wires 197 are individually insulated and then wrapped together in an Inconel braid or alumina tubes. In other embodiments, because the thermocouple wires are protected by the shaft 200, an Inconel braid is not employed.

FIGS. 2-4 describe several systems that may be used to route the wires from the controller 180 to the thermocouple 198. FIGS. 5-9 show various embodiments concerning the placement of the thermocouple 198 on the target holder 190.

Figure 5:
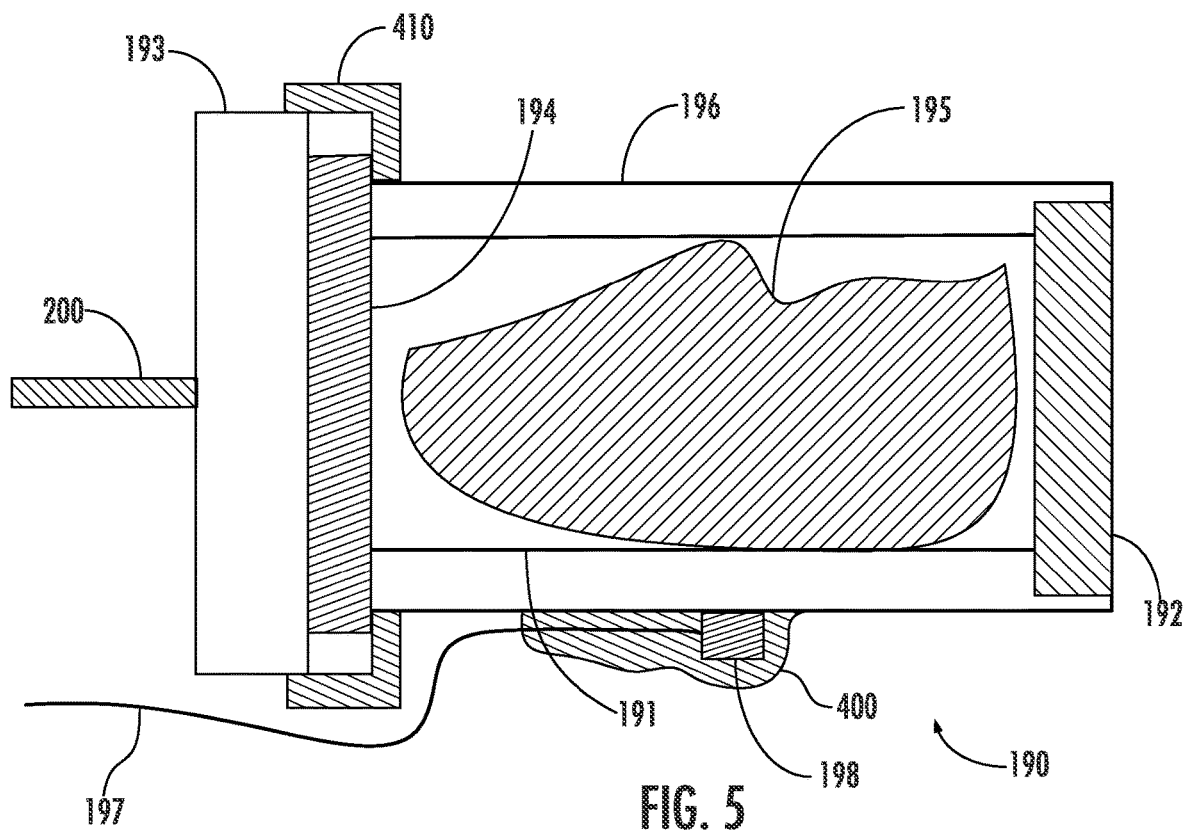
FIG. 5 shows the placement of the thermocouple on the target holder according to one embodiment.

FIG. 5 shows an enlarged view of the target holder 190. In certain embodiments, the target holder 190 comprises a target base 193, which is affixed or otherwise attached to the shaft 200. The target holder 190 may also include a crucible 196. The crucible 196 holds the dopant material 195. In certain embodiments, the crucible 196 may be made from graphite. In some embodiments, the crucible 196 may be a hollow cylinder having two open ends. A crucible plug 194 may be disposed between the crucible 196 and the target base 193. The crucible plug 194 is used to plug one of the open ends of the crucible 196. Clamp 410 may be used to secure the target base 193 to the crucible 196. As described above, a porous plug 192 may be used to plug the second open end of the crucible 196. As stated above, this porous plug 192 may be made from graphite foam or another suitable material.

In the embodiment of FIG. 5, the thermocouple 198 is mounted on an outer surface of the crucible 196. Potting material 400 may be used to hold the thermocouple 198 in place. The thermocouple wires 197 may be routed along the exterior of the target holder 190.

Figure 6:
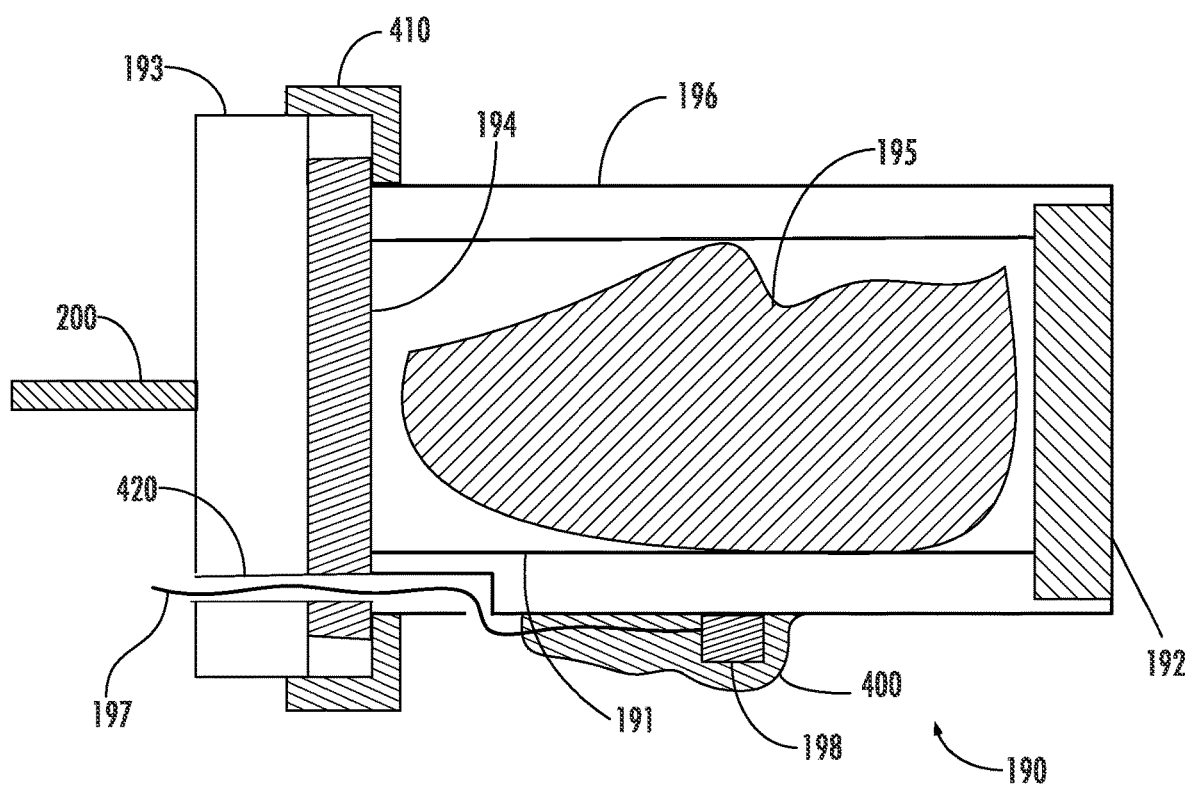
FIG. 6 shows the placement of the thermocouple on the target holder according to a second embodiment.

FIG. 6 shows another embodiment of the target holder 190. Many of the components are the same as shown in FIG. 5 and have been given identical reference designators. In this embodiment, a conduit 420 is created in the target base 193 and optionally in the crucible plug 194. The thermocouple wires 197 pass through the conduit 420 and the thermocouple 198 is mounted on the outer surface of the crucible 196, as was done in FIG. 5. Potting material 400 may be used to hold the thermocouple 198 in place.

Figure 7:
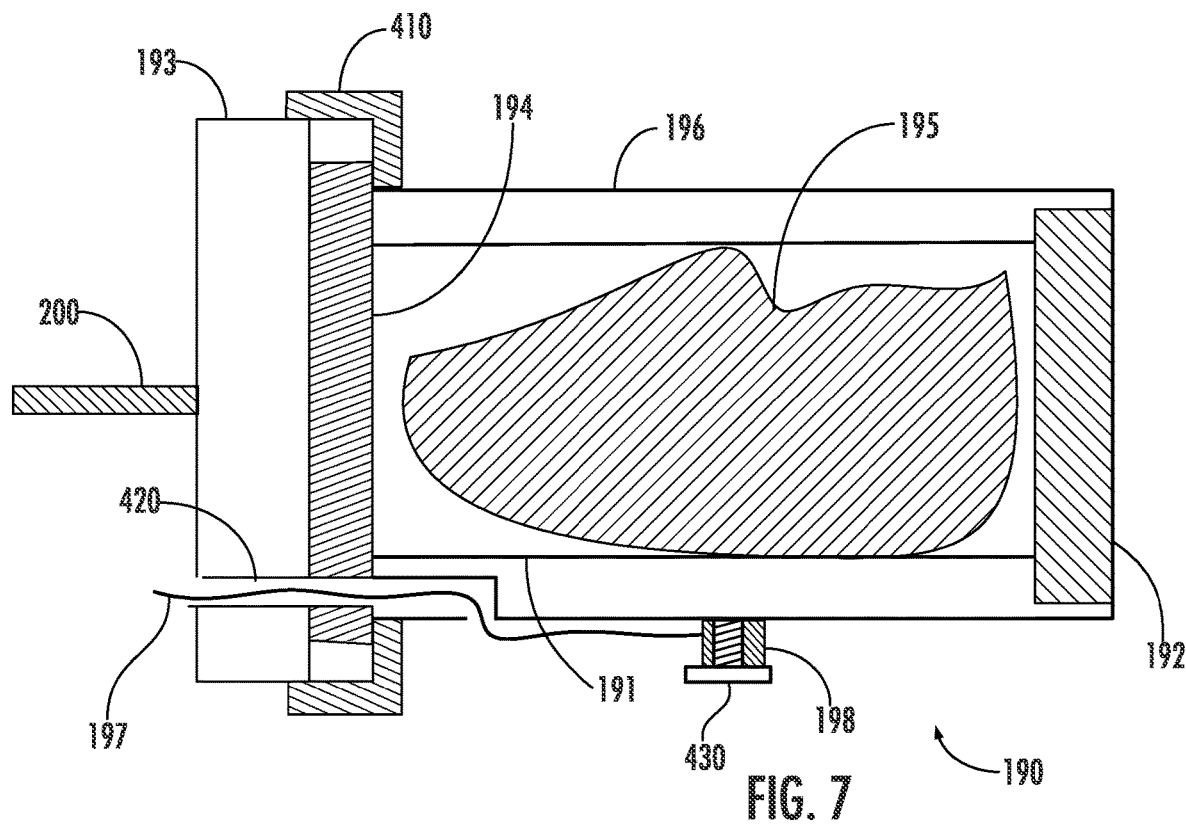
FIG. 7 shows the placement of the thermocouple on the target holder according to another embodiment.

FIG. 7 shows another embodiment of the target holder 190. Many of the components are the same as shown in FIG. 6 and have been given identical reference designators. In this embodiment, rather than using potting material, a set screw 430 is used to hold the thermocouple 198 in place. The set screw 430 may screw into a threaded shallow hole in the crucible 196. In some embodiments, the threaded shallow hole does not pass through to the interior of the crucible 196.

It is noted that the set screw 430 may be used with the embodiment of FIG. 5. In other words, the thermocouple wires 197 may be routed around the exterior of the target holder 190 and be secured to the crucible 196 using set screw 430.

In summary, FIGS. 5-7 show different target holders 190 where the thermocouple 198 is in contact with an outer surface of the crucible 196. This thermocouple 198 may be affixed to the crucible 196 using a potting material 400 or a set screw 430. Other fastening techniques may also be employed.

Figure 8A:
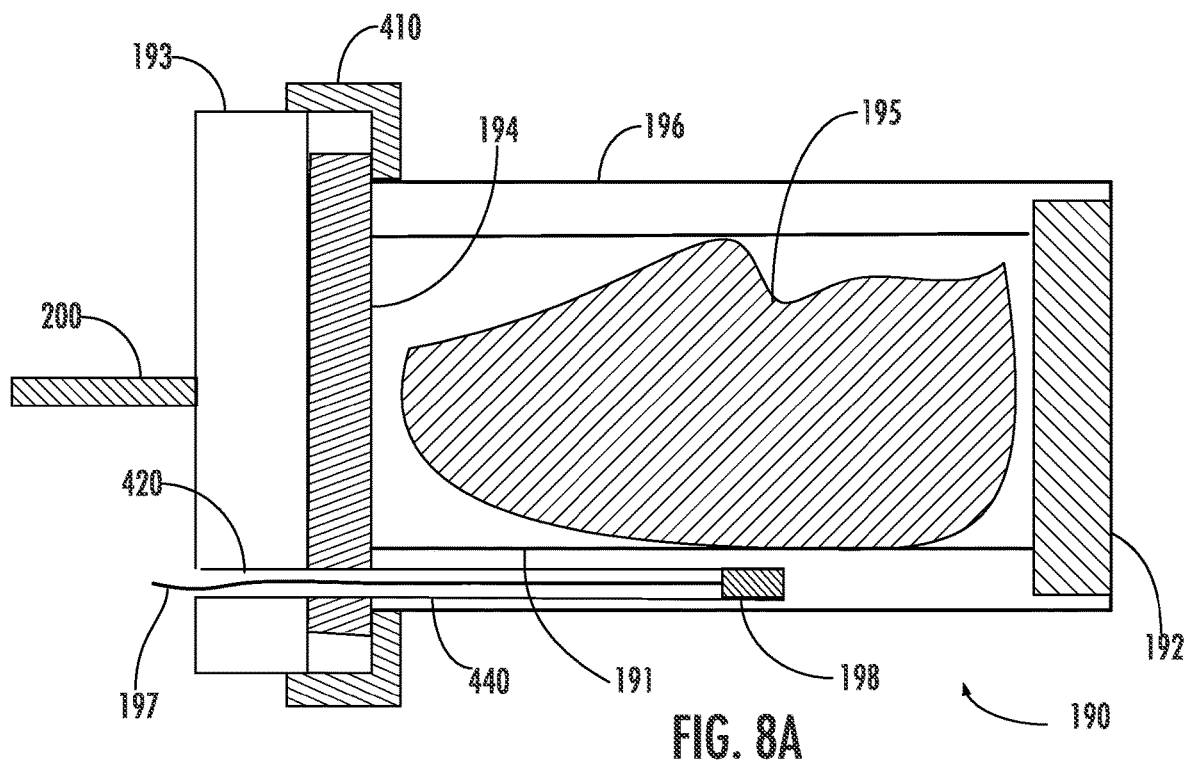
FIGS. 8A-8B show the placement of the thermocouple on the target holder according to other embodiments.
Figure 8B:
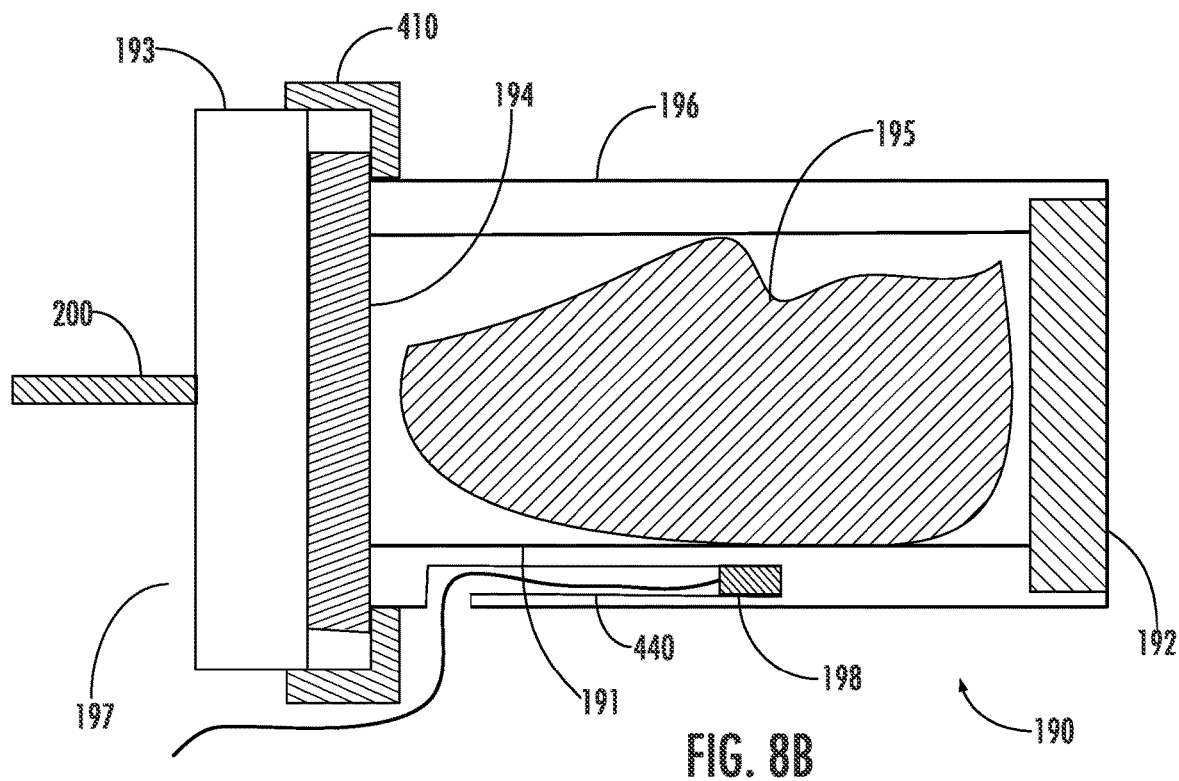

Additionally, the thermocouple 198 may be embedded in the wall of the crucible 196. FIG. 8A shows an embodiment where a channel 440 is created in the wall of the crucible. Many of the components are the same as shown in FIG. 6 and have been given identical reference designators. The channel 440 is narrower than the width of the wall of the crucible 196. The thermocouple 198 is inserted into the channel 440. Potting material (not shown) may be used to hold the thermocouple 198 in place. In this embodiment, the channel 440 may extend through the target base 193 and optionally the crucible plug 194. In another embodiment, shown in FIG. 8B, the channel 440 exits on the outer surface of the crucible 196. In this embodiment, the channel does not extend through the target base 193 or the crucible plug 194.

In another embodiment, the channel 440 may extend to the pocket 191, so that the thermocouple 198 is actually in contact with an interior of the pocket 191 and/or the dopant material 195. In these embodiments, a ceramic insulator sheath may be employed to protect the thermocouple 198 and the thermocouple wires 197.

Figure 9A:
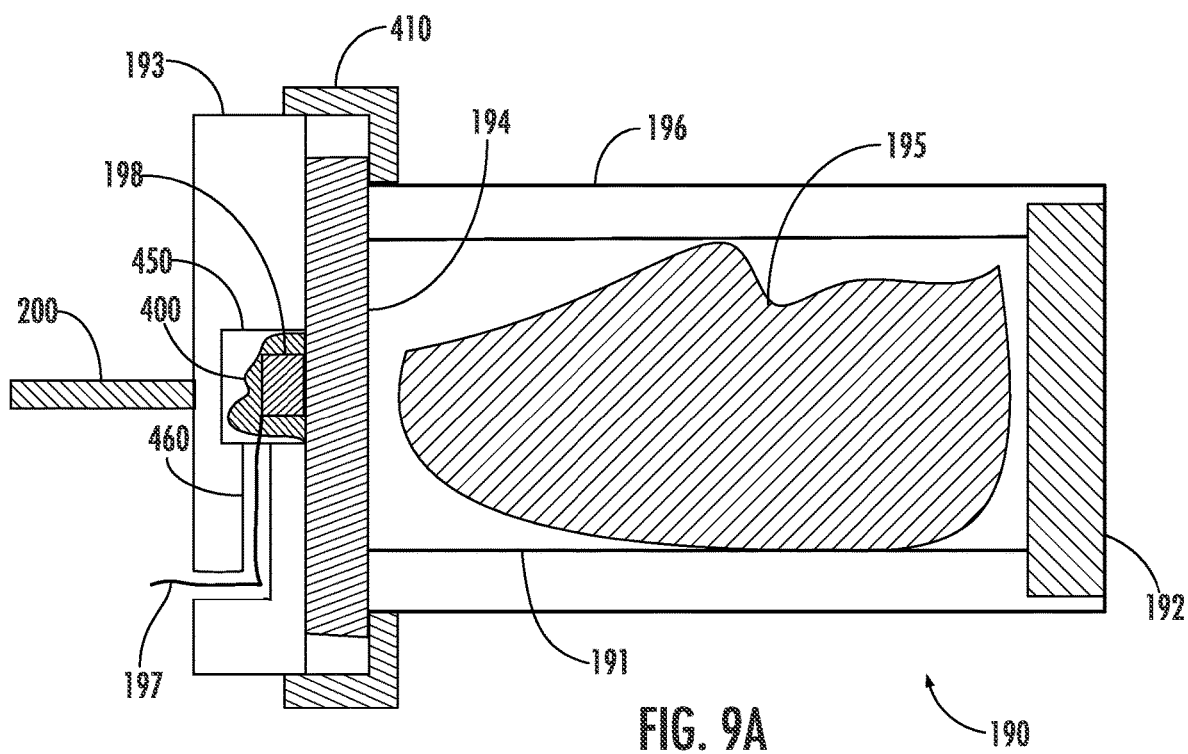
FIGS. 9A-9C show the placement of the thermocouple on the target holder according to other embodiments.
Figure 9B:
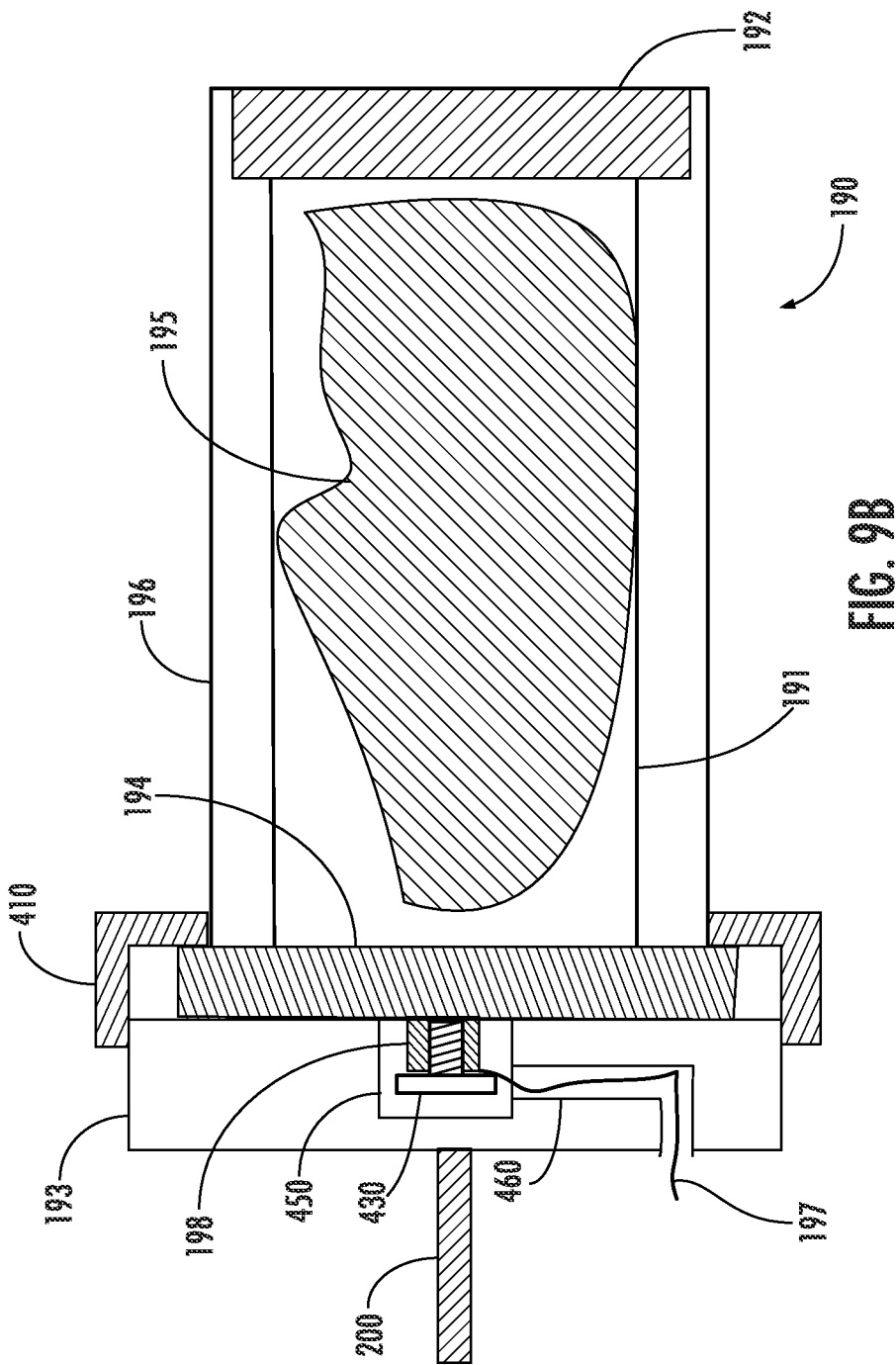
Figure 9C:
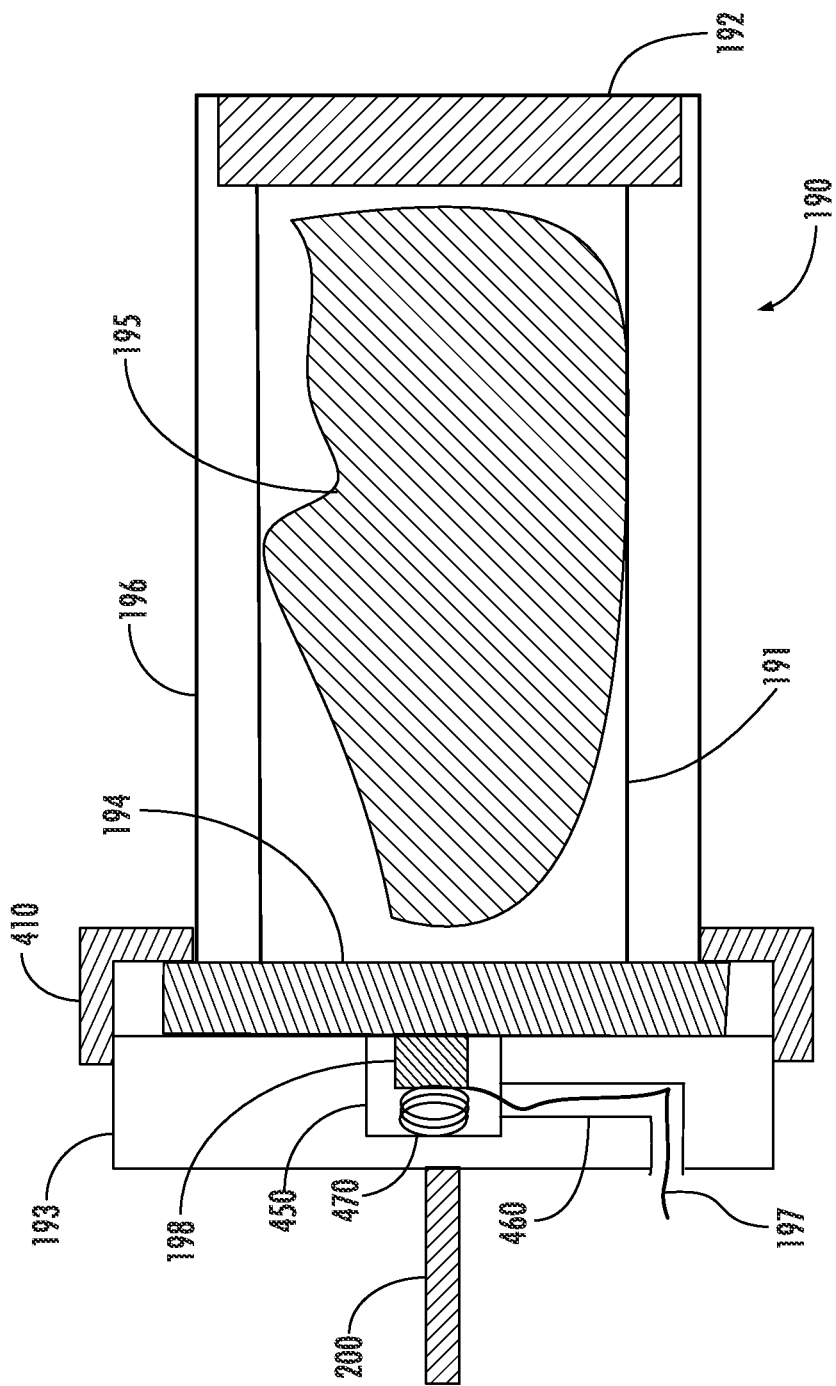

The thermocouple 198 may also be in contact with the crucible plug 194, as shown in FIGS. 9A-9C. Many of the components are the same as shown in FIG. 6 and have been given identical reference designators. In these embodiments, a cavity 450 is disposed in the target base 193. The cavity 450 provides a location where the thermocouple 198 can be placed. A channel 460 is created in the target base 193 from an exterior of the target base 193 to the cavity 450. Thermocouple wires 197 enter the cavity 450 via the channel 460. FIG. 9A shows the thermocouple 198 held in place through the use of potting material 400. FIG. 9B shows the thermocouple 198 held in place using a set screw 430. FIG. 9C shows the thermocouple 198 held in place through the use of a spring 470. Of course, other force-based means may also be used to hold the thermocouple 198 in place.

While the above disclosure describes various apparatus for routing the wires for the thermocouple 198 to the target holder 190, the same techniques may also be used to route resistive wires to the target holder 190. These resistive wires may be employed as a heating element 170. For example, resistive wires may be in contact with all or a portion of the outer surface of the crucible 196, as shown in FIGS. 1-4. The resistive wires may be routed using the same means as shown in FIGS. 2-7. Alternatively, the resistive wires may be embedded in the wall of the crucible, similar to the embodiments shown in FIGS. 8A-8B. In another embodiment, the resistive wires may be in contact with the crucible plug 194, such as shown in FIGS. 9A-9C. When a current is passed through the resistive wires, heat is generated. This may allow the controller 180 another mechanism to control the temperature of the dopant material 195.

In certain embodiments, the resistive wires are bundled with the thermocouple wires 197. In these embodiments, the resistive wires are routed with the thermocouple wires 197.

In other embodiments, the resistive wires are provided in a separate braid or bundle, and traverse the same path as the thermocouple wires 197.

Figure 10:
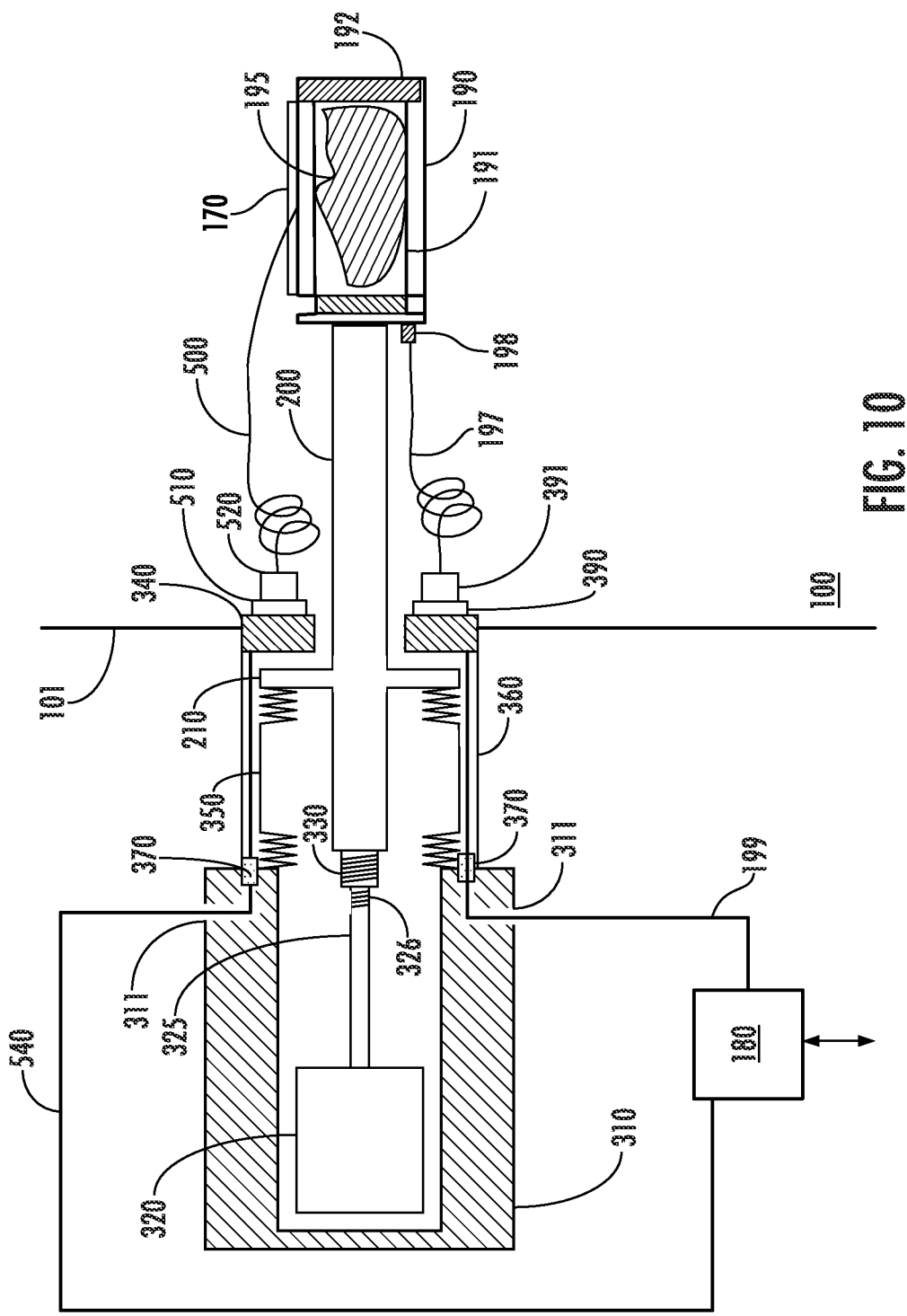
FIG. 10 shows the actuator assembly and target holder according to one embodiment where resistive wires are used to heat the target holder.

In yet other embodiments, the resistive wires may be in contact with one part of the target holder 190, such as the crucible 196, while the thermocouple 198 is in contact with another part of the target holder 190, such as the crucible plug 194. FIG. 10 shows an embodiment where the resistive wires 500 are separate from the thermocouple wires 197. This embodiment is similar to FIG. 2, but includes a third connector 510 and a fourth connector 520. The third connector 510 may be mounted to the front housing 340. Wires 540 from the controller 180 are routed to the third connector 510. In certain embodiments, the components used for routing the wires 540 are similar to those for routing the wires 199. For example, a channel 311 and vacuum feedthrough 370 may be employed. The resistive wires 500 may be coiled to allow changes in length and may be connected to an outer surface of the crucible or to the crucible plug.

Although FIG. 10 shows a third and fourth connector, it is understood that the resistive wires 500 may also be routed with the wires 199 and a larger connector may be used.

Alternatively, the resistive wires 500 may also be routed through the shaft 200, similar to the routing of wires 199 shown in FIGS. 3-4.

The above disclosure describes various embodiments that allow the controller 180 to monitor the temperature of the dopant material 195 by measuring the temperature of a component (i.e. the crucible, the crucible plug, etc.) using a thermocouple 198. The controller 180 may use this information in a variety of ways.

It may be advantageous to heat the dopant material 195 to a temperature within a predetermined range. For example, at low temperatures, the dopant material 195 may not melt, and therefore no dopant vapor is released from the target holder 190. However, at excessively high temperatures, the melt rate of the dopant material may be too great. This may cause accumulation of dopant material in the arc chamber 100. Additionally, variation in the melt rate may also affect the beam current and other parameters.

By monitoring the temperature at or near the target holder 190, the controller 180 may be able to better regulate the temperature of the dopant material 195. For example, the controller 180 may monitor the temperature of the dopant material 195. If the temperature is not within the predetermined range, the controller may change the current through filament power supply 165, change the arc voltage, change cathode bias voltage, alter the flow rate of gas into the arc chamber 100, change the position of the target holder 190 in the arc chamber 100, vary the beam extraction current or perform a combination of these actions. Furthermore, if first and second electrodes are disposed on walls 101, the voltage applied to these electrodes may also be varied by the controller 180 based on the temperature of the dopant material 195. Additionally, in embodiments where a heater is employed, such as through the use of resistive wires 500, the controller 180 may vary the current through the heater to change the temperature of the dopant material 195.

In certain embodiments, the controller 180 may move the position of the target holder 190 within the arc chamber 100 based on the temperature of the dopant material 195. For example, the target holder 190 may heat to a higher temperature when disposed directly in the cylindrical region defined between the cathode 110 and the repeller 120. To slow the heating of the dopant material, the target holder 190 may be moved linearly to be outside this cylindrical region. Conversely, to increase the temperature of the dopant material 195, the target holder 190 may be moved into this cylindrical region.

The controller 180 may employ various closed loop algorithms to determine the parameters associated with the IHC ion source 10 based on the temperature obtained by the thermocouple 198.

While the above disclosure describes the use of a thermocouple 198, other temperature sensors may also be used. For example, optical measurements, a pyrometer, and color dots are all indirect methods of detecting the temperature of the target holder 190. RTDs (resistance temperature detectors) and wireless thermocouple readers may also be employed. Thus, the above disclosure is not limited to the use of thermocouples.

Further, while the above disclosure describes the thermocouple 198 as being in contact with the target holder 190 or the dopant material 195, other embodiments are also possible. For example, the thermocouple 198 (or other temperature sensor) may measure the temperature of another component within the arc chamber 100 and estimate the temperate of the dopant material based on this measured temperature. This other component may be a wall of the arc chamber 100, the shaft 200, the repeller 120, the front housing 340, or another component.

Further, the control described above may be performed using open loop techniques. For example, empirical data may be collected to determine the temperature of the dopant material as a function of various parameters, such as cathode bias voltage, arc voltage, feed gas flow rate, and position of the target holder. The empirical data may also determine the temperature of the dopant material as a function of time. Using tables or equations, the controller 180 may vary one or more of the parameters to maintain the dopant material 195 within a predetermined range. For example, the controller 180 may move the target holder 190 over time to maintain its temperature within the desired range.

While the above disclosure describes the use of a target holder in an indirectly heated cathode ion source, the disclosure is not limited to this embodiment. The target holder, actuator assembly and thermocouple may also be employed in other ion or plasma sources, such as capacitively coupled plasma sources, inductively coupled plasma sources, a Bernas source or another suitable source.

The embodiments described above in the present application may have many advantages. Using an insertable target holder allows for pure metal dopants to be used as sputter targets in an environment that exceeds their melting temperature. Traditionally, an oxide/ceramic or other solid compound containing the dopant that has a melting temperature of greater than 1200° C. is used. The use of a dopant-containing compound rather than a pure material severely dilutes the available dopant material. For example, when using $Al_2O_3$ as an alternative to pure aluminum, the stoichiometry of the ceramic composition not only introduces impurities into the plasma, possibly introducing undesirable mass coincidences with the dopant of interest, but also leads to lower beam currents than a pure elemental target. Use of $Al_2O_3$ may also lead to generation of undesirable byproducts, such as oxides and nitrides, which can be deposited along the beamline and compromise the operation of the ion implanter. For instance, the beam optics may be cleaned chemically to maintain ion beam stability after use of $Al_2O_3$.

In one experiment, beam currents of up to 4.7 mA were achieved using a pure Al sputter target, whereas a maximum beam current of less than 2 mA could be achieved using an $Al_2O_3$ target. Use of pure metals will also increase the multi charge beam currents by 50%-75% as compared to the beam currents obtained from oxides/ceramics of the same metal species. With the insertable container, access to a large volume of pure metal is available when needed and the solid target can be safely removed from the arc chamber to utilize other species.

Further, by monitoring the temperature of the dopant material, the ion source can be controlled to ensure that the melt rate of the dopant material is within a predetermined range. Specifically, without temperature control, it is possible that the dopant feed may become unstable and prone to runaway effect that can cause inconsistent beam performance and lead to undesired accumulation of dopant material in the arc chamber. Thus, temperature control prevents exponential increase in dopant vapor in the arc chamber. It also allows faster tuning of the ion source.

Additionally, by monitoring the temperature of the dopant material, it is possible to use this information in the beam tuning process, thus making beam performance more reliable.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A target holder to hold a dopant material, for use in an ion source, the target holder comprising:
   a target base;
   a crucible shaped as a hollow cylinder; and
   a porous plug to cover one open end of the crucible, wherein gaseous dopant material may pass through the porous plug, and wherein the porous plug comprises graphite foam.

2. The target holder of claim 1, further comprising a crucible plug to cover an opposite open end of the crucible and disposed proximate the target base.

3. The target holder of claim 1, further comprising a thermocouple in communication with the target holder.

4. The target holder of claim 3, wherein the thermocouple is affixed to an outer surface of the crucible.

5. The target holder of claim 3, wherein the thermocouple is disposed in a channel in a wall of the crucible.

6. The target holder of claim 3, further comprising a crucible plug to cover an opposite open end of the crucible and disposed proximate the target base, wherein a cavity is disposed in the target base proximate the crucible plug and the thermocouple is disposed in the cavity proximate the crucible plug.

7. The target holder of claim 6, wherein a channel is disposed in the target base, the channel in communication with the cavity to allow wires to be routed to the thermocouple.

8. The target holder of claim 3, further comprising a shaft affixed to the target base, wherein an interior of the shaft is hollow to allow wires to be routed through the hollow interior of the shaft to the thermocouple.

9. The target holder of claim 1, further comprising a heating element in communication with the target holder, wherein the heating element comprises resistive wires.

10. The target holder of claim 1, further comprising a clamp to secure the crucible to the target base.

11. The target holder of claim 1, wherein the target base is attached to a shaft.

12. An indirectly heated cathode ion source, comprising:
   an arc chamber, comprising a plurality of walls connecting a first end and a second end;
   an indirectly heated cathode disposed on the first end of the arc chamber; and
   the target holder of claim 1.

13. The indirectly heated cathode ion source of claim 12, wherein the target base is attached to a shaft.

14. The indirectly heated cathode ion source of claim 13, further comprising an actuator in communication with the shaft to move the target holder within the arc chamber.

* * * * *